United States Patent [19]

Yamamoto et al.

[11] 4,239,536
[45] Dec. 16, 1980

[54] SURFACE-COATED SINTERED HARD BODY

[75] Inventors: Takaharu Yamamoto; Tsuyoshi Asai; Naoji Fujimori; Masa-aki Tobioka, all of Itami, Japan

[73] Assignee: Sumitomo Electric Industries, Ltd., Osaka, Japan

[21] Appl. No.: 940,617

[22] Filed: Sep. 8, 1978

[30] Foreign Application Priority Data

Sep. 9, 1977 [JP] Japan .................................. 52/107943
Nov. 28, 1977 [JP] Japan .................................. 52/143080

[51] Int. Cl.$^3$ ........................ C22C 1/05; C22C 29/00
[52] U.S. Cl. ......................................... 75/238; 75/203; 75/204; 75/202; 75/208 R; 75/244; 428/548; 428/565; 428/379; 428/380; 428/384
[58] Field of Search .............. 75/203, 204, 202, 208 R, 75/238, 244; 428/548, 565, 379, 380, 384

[56] References Cited

U.S. PATENT DOCUMENTS 3,647,576  3/1972  Yamamura et al. .................. 75/202
3,999,954  12/1976  Kolaska et al. ..................... 428/565

*Primary Examiner*—Brooks H. Hunt
*Attorney, Agent, or Firm*—Wenderoth, Lind & Ponack

[57] ABSTRACT

This invention relates to a surface-coated sintered hard body comprising an alloy consisting of at least one of carbides and carbonitrides of Group IVa, Va and VIa transition metals, cemented by at least one of metals and alloys, and two interior and exterior coated layers, the interior layer being a monolayer or multilayer consisting of at least one of carbides, carbonitrides and nitrides of Group IVa, Va and VIa transition metals, in which a part of the non-metallic element or elements are optionally replaced by oxygen, and at least one layer of the interior layer consisting of at least one of carbides, carbonitrides and nitrides of Group IVa, Va and VIa transition metals, in which a part or all of the non-metallic element or elements are replaced by boron, and the exterior layer consisting of at least one of aluminum oxide, zirconium oxide and mixtures or compounds thereof.

7 Claims, 1 Drawing Figure

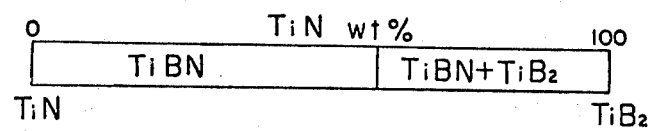

SURFACE-COATED SINTERED HARD BODY

BACKGROUND OF THE INVENTION

1. Field of the Invention

This invention relates to a surface-coated sintered hard body and more particularly, it is concerned with surface-coated cemented carbide or carbonitride alloys having at least one boron-containing coating layer, which exhibit good performances.

2. Description of the Prior Art

The so-called surface-coated cemented carbides or carbonitrides articles having a thin coating layer of TiC or TiN possessing excellent wear resistance have widely been put to practical use as a cutting tool having more excellent toughness as well as more excellent wear resistance than the prior art cemented carbides or carbonitrides articles. These cemented carbides or carbonitrides articles consist of at least one of carbides and carbonitrides of at least one element selected from titanium, zirconium, hafnium, vanadium, niobium, tantalum, chromium, molybdenum and tungsten, cemented by at least one metal from the iron group. The TiC-coated cemented carbides or carbonitrides have more excellent cutting properties than the prior art cemented carbides or carbonitrides, but the cutting properties have hitherto been improved only to some extent because titanium carbide meets with a marked lowering of hardness at a high temperature and lacks in oxidation resistance. In order to overcome these disadvantages, cemented carbide alloys coated with ceramic materials such as $Al_2O_3$ and $ZrO_2$ have been proposed. However, the adhesive strength of such a ceramic layer to a cemented carbide alloy is not sufficient for practical use and, therefore, it has been proposed to use at least one of carbides and nitrides of metals such as titanium, zirconium, etc. between the ceramic layer and cemented carbide alloy. In fact, this laminated article has really been used. When, for example, a titanium carbide and/or nitride is used as a layer under an $Al_2O_3$ layer as described above, however, the low oxidation resistance at a high temperature, which is one of the above described two disadvantages of the TiC-coated cemented carbides, is somewhat improved, but the lowering of the hardness at a high temperature as a whole is only improved partly. That is to say, even if the surface is coated with a ceramic material whose hardness is not so lowered even at a high temperature, such lowering of hardness of the coated layers as a whole is unavoidable as far as TiC is used under the ceramic layer.

SUMMARY OF THE INVENTION

It is an object of the present invention to provide a surface-coated sintered hard body having excellent properties.

It is another object of the present invention to provide cemented carbide or carbonitride alloy coated with a boron-containing layer, which are excellent in hardness at a high temperature.

It is a further object of the present invention to provide a surface-coated sintered hard body having, as an intermediate layer a layer, having a sufficient adhesive strength to both cemented carbides or carbonitrides and ceramic materials.

These objects can be attained by a surface-coated cemented carbides or carbonitrides article having at least one layer consisting of at least one material selected from boronitrides and borocarbonitrides of Group IVa, Va and VIa elements.

BRIEF DESCRIPTION OF THE DRAWING

The accompanying drawing is a pseudo-binary phase diagram of $TiN-TiB_2$ at 1000° C.

DETAILED DESCRIPTION OF THE INVENTION

We, the inventors, have reached the present invention by choosing a material whose hardness is not so lowered even at a high temperature and which has a sufficient adhesive strength to a cemented carbide or carbonitride and a ceramic material such as alumina or zirconia, as an intermediate layer between them. We have already found that when cemented carbide or carbonitride articles are coated with carbides, nitrides and oxides of Group IVa, Va and VIa transition metals, and mixtures or compounds thereof, by the chemical vapor deposition method, the adhesive strength between the coated layer and cemented carbide or carbonitride substrate is decreased in the order of the carbides, nitrides and oxides, and it is practically preferable to use the carbides or carbonitrides. Further, we have now found that carbides, nitrides and oxides of Group IVa, Va and VIa transition metals, and mixtures or compounds thereof, in which a part or all of the non-metallic constitutional element or elements are replaced by boron, have a hardness that is not so lowered even at a high temperature. The present invention is based on this finding.

In accordance with the present invention, therefore, there is provided a surface-coated sintered hard body comprising an alloy consisting of at least one of carbides and carbonitrides of Group IVa, Va and VIa transition metals, in which a part of the non-metallic element or elements can be replaced by oxygen and boron, cemented by at least one member selected from the group consisting of the iron group metals, tungsten, chromium and molybdenum and alloys thereof, and two interior and exterior coated layers, the interior layer being a monolayer or multilayer consisting of at least one of carbides, carbonitrides and nitrides of Group IVa, Va and VIa transition metals, in which a part of the non-metallic element or elements are replaced optionally by oxygen, and at least one layer of the interior layer consisting of at least one of carbides, carbonitrides and nitrides of Group IVa, Va and VIa transition metals, in which a part (in the case of a monolayer) or all of the non-metallic element or elements are replaced by boron, and the exterior layer consisting of at least one of aluminum oxide ($Al_2O_3$) and zirconium oxide ($ZrO_2$) and mixtures or compounds thereof including solid solutions.

The binder metal in the above mentioned sintered hard body can further contain the hard phase-forming elements and ordinary additives such as aluminum, silver, copper, phosphorus, silicon, etc.

In the present invention, Group IVa metals of the Periodic Table mean titanium (Ti), zirconium (Zr) and hafnium (Hf), Group Va metals mean vanadium (V), niobium (Nb) and tantalum (Ta) and Group VIa metals mean chromium (Cr), molybdenum (Mo) and tungsten (W). Of the interior layers, the most interior layer in contact with the surface of the cemented carbide or carbonitride alloy consists preferably of carbides and/or carbonitrides of Group IVa, Va and VIa transition metals and the outside interior layer in contact with the exterior layer consists preferably of the hard compounds in which a part of the non-metallic elements are replaced by oxygen. Even if the interior layer is not of a clear laminate structure, but has a composition which changes gradually or continuously, the effects of the present invention can similarly be obtained.

In the present invention, the thickness of the coating layers, as a whole, is preferably 2 to 10 microns, that of the interior layer being preferably 0.1 to 10 microns and that of the exterior layer being 0.1 to 5 microns.

One of the important properties required for such a coating material is a high hardness at such a high temperature to which a tool edge is exposed during a cutting operation, for example, at about 1000° C. From this point of view, diborides of Ti, Zr and Hf, in particular, $TiB_2$, having a remarkably high hardness at a high temperature are most preferable, but, in fact, these diborides are not so preferable because of their reaction with iron as a workpiece to be cut, resulting in a marked progress of crater wear. The inventors have made various efforts to suppress this reaction with iron and have noted that nitrides of Ti, Zr and Hf, in particular, TiN, lack in reactivity with iron and show a very small crater wear. However, TiN has only a low hardness at a high temperature and it is thus assumed that a substance having an intermediate property between those of TiN and $TiB_2$ will satisfy both the hardness at a high temperature and the reactivity with iron.

In one aspect of the present invention, therefore, there is provided a surface-coated cemented carbide or carbonitride article having at least one coating layer consisting of at least one material selected from boronitrides and borocarbonitrides of Group IVa, Va and VIa elements. Particularly, one preferred embodiment of the present invention consists in a cemented carbide or carbonitride alloy surface-coated with one layer consisting essentially of a mixture of 0 to 50%, preferably 5 to 50%, by weight of at least one of diborides of Ti, Zr and Hf and 50 to 100%, preferably 50 to 95%, by weight of at least one of boronitrides and borocarbonitrides of Ti, Zr and Hf. If necessary, this coating layer can further be coated with a ceramic material such as $Al_2O_3$ as an exterior layer.

The inventors have made various samples by the chemical vapor deposition method to study the phase diagram of TiN and $TiB_2$ and, consequently, have found that there is a two phase coexistent zone of Ti(BN) and $TiB_2$ and a one phase zone of Ti(BN) at about 1000° C. as shown schematically in the accompanying drawing. A sample of a surface-coated article prepared based on this result has an advantage as expected. As to the quantity of $TiB_2$, it should not exceed 50% by weight since if more than 50% by weight, the reaction with iron as a workpiece cannot be neglected. As to Ti(BN), a part of the non-metallic elements can be replaced by carbon and yet still obtain the substantial effect of the present invention.

Although the above described illustration is limited to Ti only, the present invention can of course be applied to Zr and Hf with similar advantages. In addition, the advantages or merits of the present invention are scarcely affected by the presence of small amounts of impurities and additives.

The above described boron-containing coating layer can be used with one or more other coating layers to thus give synergistic effects. When the boron-containing coating layer is further coated with, for example, aluminum oxide, which is excellent in oxidation resistance, the oxidation resistance of the surface-coated article as a cutting tool can markedly be improved.

The coating layer of the present invention can best be formed by the chemical vapor deposition method, but physical vapor deposition methods such as ionic plating, sputtering, vacuum vapor deposition and the like, and metallizing plating methods such as plasma spraying, flame spraying and the like can also be applied.

The present invention will be further illustrated in greater detail in the following examples. It will be self-evident to those skilled in the art that the ratios and ingredients in the following formulation and the order of operations can be modified wihtin the scope of the present invention. Therefore, the present invention is not to be interpreted as being limited to the following examples. All percents are to be taken as those by weight unless otherwise indicated.

EXAMPLE 1

A cemented carbide alloy of ISO P 30 (free carbon precipitated: 0.03%; Form No.: SNU 432) was heated in a mixed stream of $TiCl_4$, $CH_4$, $H_2$ and $N_2$ in a reactor of Inconel (Commercial Name, nickel alloy manufactured by Inco Co.) to deposit a coating of Ti(CN), and thereafter, there was deposited Ti(BN) (B-substituent of TiN) from a mixed stream of $TiCl_4$, $BCl_3$, $H_2$ and $N_2$ in the same reactor. Then, there was further deposited Ti(CO) (O-substituent of TiC) from a mixed stream of $TiCl_4$, $CH_4$, $CO_2$, CO and $H_2$ in the same reactor. The thickness of the interior layers amounted to 6 microns. After cooling, the thus surface-coated cemented carbide alloy was further heated in a mixed stream of $AlCl_3$, $CO_2$ and $H_2$ in a reactor of sintered alumina to thus precipitate a coating of $Al_2O_3$ with a thickness of 1 micron. An insert obtained in this way will hereinafter be referred to as Insert Sample A.

Various Insert Samples B to L were prepared in an analogous manner to that described above and, for comparison, a commercially sold TiC-coated insert (Insert Sample M) and an $Al_2O_3$/TiC coated insert (Insert Sample N) were prepared, which were then subjected to a cutting test under the following conditions:

| Workpiece to be cut | : FC 30 |
| --- | --- |
| Cutting Speed | : 150 m/min |
| Feed | : 0.40 mm/rev |
| Cutting Depth | : 2 mm |
| No Cutting Aid | |

The results are shown in Table 1:

TABLE 1

| Insert Sample | Exterior Layer | | Interior Layers (in order of from outside) | | Life (min) |
| --- | --- | --- | --- | --- | --- |
| A | $Al_2O_3$ | 1μ | Ti(CO)—Ti(BN)—Ti(CN) | 6μ | 49 |
| B | $ZrO_2$ | 1μ | Ti(CO)—Ti(BN)—Ti(CN) | 6μ | 36 |
| C | $Al_2O_3$ | 1μ | Ti(CO)—Ti(BCN)—Ti(CN) | 6μ | 41 |
| D | $Al_2O_3$ | 1μ | Ti(CO)—Ti(BC)—TiC | 6μ | 33 |
| E | $Al_2O_3$ | 1μ | Ti(BN)—Ti(CN) | 6μ | 39 |
| F | $Al_2O_3$ | 1μ | Ti(CO)—Ti(BCO)—Ti(CN) | 6μ | 37 |
| G | $Al_2O_3$ | 1μ | Nb(CO)—Nb(BN)—Nb(CN) | 6μ | 46 |
| H | $Al_2O_3$ | 1μ | Nb(CO)—Nb(BCN)—Nb(CN) | 6μ | 40 |
| I | $Al_2O_3$ | 1μ | Zr(CO)—Zr(BN)—Zr(CN) | 6μ | 38 |
| J | $Al_2O_3$ | 1μ | Hf(CO)—Hf(BN)—Hf(CN) | 6μ | 47 |
| K | $Al_2O_3$ | 1μ | Ta(CO)—Ta(BN)—Ta(CN) | 6μ | 36 |
| L | $Al_2O_3$ | 1μ | Ta(CO)—Ta(BN)—Ta(CN) | 6μ | 37 |
| M | — | | TiC | 7μ | 9 Crater Wear |
| N | $Al_2O_3$ | 1μ | TiC | 6μ | 31 Flank |
| Insert Sample | Exterior Layer | | Interior Layers (in order of from outside) | | Life (min) |
| | | | | | Wear |

EXAMPLE 2

A cemented carbide alloy of ISO P-30 (Form No. SNU 432) was heated and held at 1000° C. in a mixed stream of $BCl_3$, $TiCl_4$, $N_2$ and $H_2$. The coating thickness was $7\mu$. Analysis of the surface by X-ray diffraction after cooling showed that there were two phases of 30% by weight of $TiB_2$ and 70% by weight of Ti(BN). The resulting insert sample and a commercially sold TiC-coated insert sample were subjected to a cutting test under the following conditions:

| Workpiece to be cut | : SCM 3 ($H_B$ = 280) |
|---|---|
| Cutting Speed | : 170 m/min |
| Feed | : 0.36 mm/rev |
| Cutting Depth | : 2 mm |
| Cutting Time | : 40 minutes |

Thus, the insert of the present invention showed a crater wear of 0.04 mm and a flank wear of 0.18 mm, while the commercially sold TiC-coated insert showed a crater wear of 0.14 mm and a flank wear of 0.36 mm.

EXAMPLE 3

The same cemented carbide alloy as that of Example 2 was heated and held at 1000° C. in a mixed stream of $CH_4$, $BCl_3$, $TiCl_4$, $N_2$ and $H_2$. The coating thickness was $7\mu$. Analysis of the surface in an analogous manner to Example 2 after cooling showed that there were two mixed phases of 30% by weight of $TiB_2$ and 70% by weight of Ti(BNC). When the resulting insert was subjected to a cutting test under the same conditions as those of Example 2, it showed a crater wear of 0.10 mm and flank wear of 0.17 mm.

EXAMPLE 4

The same cemented carbide alloy as that of Example 2 was coated with various materials in an analogous manner to Example 2 and then subjected to a cutting test under the same conditions as those of Example 2, in which the lives were measured by a period of time when the crater wear reached 0.15 mm or the flank wear reached 0.40 mm. The compositions of the coated layers and the test results are shown in Table 2:

TABLE 2

| Insert Sample | Composition of Coating Layer | | Life (min) |
|---|---|---|---|
| I | 100% Ti(BN) | $7\mu$ | 51 |
| II | 20% $TiB_2$—80% Ti(BN) | $7\mu$ | 55 |
| III | 40% $TiB_2$—60% Ti(BN) | $7\mu$ | 58 |
| IV | 60% $TiB_2$—40% Ti(BN) | $7\mu$ | 31 |
| V | 80% $TiB_2$—20% Ti(BN) | $7\mu$ | 8 |
| VI | 100% $TiB_2$ | $7\mu$ | more than 1 |
| VII | 100% TiC | $7\mu$ | 37 |

EXAMPLE 5

The same cemented carbide alloy as that of Example 2 was coated with various materials in an analogous manner to Example 3 and then subjected to a cutting test under the same conditions as those of Example 2, in which the lives were measured by a period of time when the crater wear reached 0.15 mm or the flank wear reached 0.40 mm. The compositions of the coated layers and the test results are shown in Table 3:

TABLE 3

| Insert Sample | Composition of Coating Layer | | Life (min) |
|---|---|---|---|
| I | 100% Ti(BNC) | $7\mu$ | 48 |
| II | 80% Ti(BNC)—20% $TiB_2$ | $7\mu$ | 51 |
| III | 60% Ti(BNC)—40% $TiB_2$ | $7\mu$ | 55 |
| IV | 40% Ti(BNC)—60% $TiB_2$ | $7\mu$ | 12 |
| V | 20% Ti(BNC)—80% $TiB_2$ | $7\mu$ | 3 |
| VI | 100% $TiB_2$ | $7\mu$ | more than 1 |
| VII | 100% TiC | $7\mu$ | 37 |

EXAMPLE 6

The 30% $TiB_2$-70% Ti(BN)-coated cemented carbide alloy of Example 2 was heated and held at 850° C. in a mixed stream of $AlCl_3$, $H_2$ and $CO_2$ to form a coating of aluminum oxide ($1\mu$). The thus coated insert, the insert of Example 2 and the commercially sold TiC-coated insert were then subjected to a cutting test under the following conditions:

| Workpiece to be cut | : FC 25 |
|---|---|
| Cutting Speed | : 120 m/min |
| Cutting Depth | : 2 mm |
| Feed | : 0.65 mm/rev |
| No Cutting Aid | |

The insert of this example could be used in the cutting operation for 41 minutes while the insert of Example 2 was used for only 9 minutes and the TiC-coated insert was used for only 4 minutes due to crater wear.

EXAMPLE 7

The same cemented carbide alloy as that of Example 2 was coated with various materials in analogous manners to Example 2 and Example 3 and then coated with aluminum oxide in the same manner as Example 5. The thus coated inserts and the commercially sold $Al_2O_3$/-TiC coated inserts were then subjected to a cutting test under the same conditions as those of Example 6, in which the lives were measured by a period of time when the flank wear reached 0.40 mm or the crater wear reached 0.20 mm. The compositions of the coated layers and the test results are shown in Table 4:

TABLE 4

| Insert Sample | Exterior Layer | | Interior Layer | | Life (min) |
|---|---|---|---|---|---|
| I | $Al_2O_3$ | $1\mu$ | 100% $TiB_2$ | $6\mu$ | 9 |
| II | $Al_2O_3$ | $1\mu$ | 30% $TiB_2$—70% Ti(BNC) | $6\mu$ | 38 |
| III | $Al_2O_3$ | $1\mu$ | 100% Ti(BNC) | $6\mu$ | 31 |
| IV | $Al_2O_3$ | $1\mu$ | 70% $TiB_2$—30% Ti(BN) | $6\mu$ | 11 |
| V | $Al_2O_3$ | $1\mu$ | 30% $TiB_2$—70% Ti(BN) | $6\mu$ | 41 |
| VI | $Al_2O_3$ | $1\mu$ | 100% Ti(BN) | $6\mu$ | 32 |
| VII | $Al_2O_3$ | $1\mu$ | TiC | $6\mu$ | 30 |

What is claimed is:

1. A surface-coated sintered hard body, which comprises a sintered hard alloy and at least one coating layer thereon comprising at least one material selected from boronitrides and borocarbonitrides of Group IVa, Va and VIa elements.

2. The surface-coated sintered hard body as claimed in claim 1, wherein the sintered hard alloy comprises at least one of carbides and carbonitrides of Group IVa, Va and VIa transition metals, cemented by at least one member selected from the group consisting of the iron group metals, tungsten, chromium and molybdenum, and alloys thereof.

3. The surface-coated sintered hard body as claimed in claim 1, wherein the coating layer comprises a mixture of 5 to 50% by weight of at least one of diborides of titanium, zirconium and hafnium and 50 to 95% by weight of at least one of boronitrides and borocarbonitrides of titanium, zirconium and hafnium.

4. The surface-coated sintered hard body as claimed in claim 3, wherein the coating layer is further coated with a ceramic material selected from aluminum oxide, zirconium oxide and mixtures or compounds thereof.

5. The surface-coated sintered hard body as claimed in claim 1, wherein the coating layer comprises interior and exterior layers, the interior layer being a monolayer or multilayer comprises at least one of carbides, carbonitrides and nitrides of Group IVa, Va and VIa elements, in which a part of the non-metallic element or elements are optionally replaced by oxygen, and at least one layer of the interior layer comprises at least one of carbides, carbonitrides and nitrides of Group IVa, Va and VIa elements, in which a part or all of the non-metallic element or elements are replaced by boron, and the exterior layer comprising at least one of aluminum oxide, zirconium oxide and mixtures or compounds thereof.

6. The surface-coated sintered hard body as claimed in claim 5, wherein the coating layers, as a whole, have a thickness of 2 to 10 microns, the interior layer having a thickness of 0.1 to 10 microns and the exterior layer having a thickness of 0.1 to 5 microns.

7. The surface-coated sintered hard body as claimed in claim 5, wherein the coating layers are formed by chemical vapor deposition method.

* * * * *